United States Patent
Karakulak et al.

(10) Patent No.: US 11,574,698 B1
(45) Date of Patent: Feb. 7, 2023

(54) COMPRESSING DEEP NEURAL NETWORKS USED IN MEMORY DEVICES

(71) Applicant: SK hynix Inc., Icheon-si (KR)

(72) Inventors: Seyhan Karakulak, San Jose, CA (US); Haobo Wang, San Jose, CA (US); Aman Bhatia, San Jose, CA (US); Fan Zhang, Fremont, CA (US)

(73) Assignee: SK hynix Inc., Icheon-si (KR)

( * ) Notice: Subject to any disclaimer, the term of this patent is extended or adjusted under 35 U.S.C. 154(b) by 0 days.

(21) Appl. No.: 17/464,361

(22) Filed: Sep. 1, 2021

(51) Int. Cl.
*G11C 29/42* (2006.01)
*G11C 11/54* (2006.01)
*G11C 29/12* (2006.01)

(52) U.S. Cl.
CPC .............. *G11C 29/42* (2013.01); *G11C 11/54* (2013.01); *G11C 29/12005* (2013.01)

(58) Field of Classification Search
CPC .... G11C 29/42; G11C 11/54; G11C 29/12005
See application file for complete search history.

(56) References Cited

U.S. PATENT DOCUMENTS

| 10,614,892 B1 * | 4/2020 | Hsiao ..................... G11C 29/00 |
| 10,861,562 B1 | 12/2020 | Xiong et al. |
| 2018/0012663 A1 * | 1/2018 | Alhussien .......... H03M 13/1111 |

OTHER PUBLICATIONS

Han, S. et al., "Deep Compression: Compressing Deep Neural Networks with Pruning, Trained Quantization and Huffman Coding." Conference paper, ICLR, 2016, 14 pages.

* cited by examiner

*Primary Examiner* — Han Yang
(74) *Attorney, Agent, or Firm* — Perkins Coie LLP (57) ABSTRACT

Devices, systems and methods for improving performance of a memory device are described. An example method includes receiving one or more parameters associated with a plurality of previous read operations on a page of the memory device, wherein the previous read operations are based on a plurality of read voltages, determining, using the one or more parameters as an input to a deep neural network comprising a plurality of layers, an updated plurality of read voltages, wherein each of the plurality of layers is a fully connected layer, and applying the updated plurality of read voltages to the memory device to retrieve information from the memory device, wherein the deep neural network uses a plurality of weights that have been processed using at least one of (a) a pruning operation, (b) a non-uniform quantization operation, or (c) a Huffman encoding operation.

20 Claims, 9 Drawing Sheets

FIG. 11

COMPRESSING DEEP NEURAL NETWORKS USED IN MEMORY DEVICES

TECHNICAL FIELD

This patent document generally relates to non-volatile memory devices, and more specifically, to deep neural networks in non-volatile memory devices.

BACKGROUND

Data integrity is an important feature for any data storage device and data transmission. In solid state memory storage (e.g., NAND flash) devices, information is stored in a cell by different charge levels in a cell. During the write and read process, noise is introduced by program disturb and inter-cell interference charge leakage that causes the voltage level to drop over time, where the drop is proportional to the amount of charge stored as well as the number of program and erase (P/E) cycles a cell has experienced. Accounting for the voltage drop when determining the read voltage thresholds increases the longevity of memory devices.

SUMMARY

Embodiments of the disclosed technology relate to methods, systems and devices that improve performance of a block of a memory device. In an example, the performance of the memory device is improved by using a deep neural network (DNN), which is compressed to reduce latency and inference time, to generate read thresholds that account for the degradation of the memory cells, thereby enabling the robust retrieval of information from various types of memory devices over the entire lifespan.

In one example, a method for improving performance of a memory device is described. The method includes receiving one or more parameters associated with a plurality of previous read operations on a page of the memory device, wherein the previous read operations are based on a plurality of read voltages, and wherein the one or more parameters comprise at least one of a read bias, a ones count, or a checksum of an error correcting code for the page, determining, using the one or more parameters as an input to a deep neural network comprising a plurality of layers, an updated plurality of read voltages, wherein each of the plurality of layers is a fully connected layer, and applying the updated plurality of read voltages to the memory device to retrieve information from the memory device, wherein the deep neural network uses a plurality of weights that have been processed using at least one of (a) a pruning operation, (b) a non-uniform quantization operation, or (c) a Huffman encoding operation.

In yet another example, these methods may be embodied in the form of processor-executable instructions and stored on a computer-readable program medium.

The subject matter described in this patent document can be implemented in specific ways that provide one or more of the following features.

DETAILED DESCRIPTION

Semiconductor memory devices may be volatile or nonvolatile. The volatile semiconductor memory devices perform read and write operations at high speeds, while contents stored therein may be lost at power-off. The nonvolatile semiconductor memory devices may retain contents stored therein even at power-off. The nonvolatile semiconductor memory devices may be used to store contents, which must be retained regardless of whether they are powered.

With an increase in a need for a large-capacity memory device, a multi-level cell (MLC) or multi-bit memory device storing multi-bit data per cell is becoming more common. However, memory cells in an MLC non-volatile memory device must have threshold voltages corresponding to four or more discriminable data states in a limited voltage window. For improvement of data integrity in non-volatile memory devices, the levels and distributions of read voltages for discriminating the data states must be adjusted over the lifetime of the memory device to have optimal values during read operations and/or read attempts.

Several methods have been developed to generate optimal read voltages in a non-volatile memory device. Some methods employ a deep neural network (DNN), which is more traditionally used in areas such as computer vision (CV), natural language processing (NLP), robotics and speech. In an example, embodiments of the disclosed technology are directed to compressing the DNN that is used by a non-volatile memory system (e.g., as described in FIGS. 1-6), which advantageously reduces the latency and inference time of the DNN.

FIGS. 1-6 overview a non-volatile memory system (e.g., a flash-based memory, NAND flash) in which embodiments of the disclosed technology may be implemented.

Figure 1:
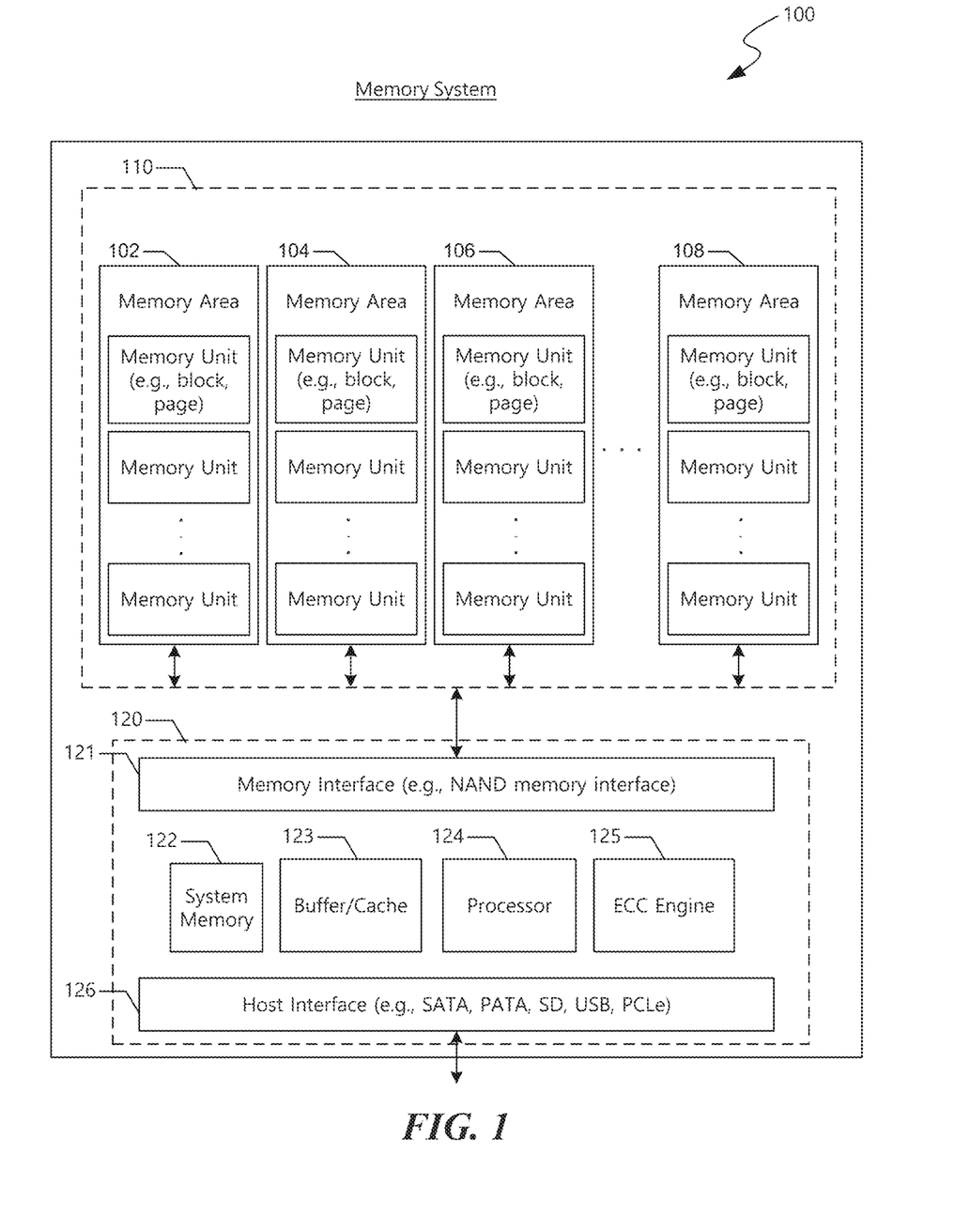
FIG. 1 illustrates an example of a memory system.

FIG. 1 is a block diagram of an example of a memory system 100 implemented based on some embodiments of the disclosed technology. The memory system 100 includes a memory module 110 that can be used to store information for use by other electronic devices or systems. The memory system 100 can be incorporated (e.g., located on a circuit board) in other electronic devices and systems. Alternatively, the memory system 100 can be implemented as an external storage device such as a USB flash drive and a solid-state drive (SSD).

The memory module 110 included in the memory system 100 can include memory areas (e.g., memory arrays) 102, 104, 106, and 108. Each of the memory areas 102, 104, 106, and 108 can be included in a single memory die or in multiple memory dice. The memory die can be included in an integrated circuit (IC) chip.

Each of the memory areas 102, 104, 106, and 108 includes a plurality of memory cells. Read, program, or erase operations can be performed on a memory unit basis. Thus, each memory unit can include a predetermined number of memory cells. The memory cells in a memory area 102, 104, 106, and 108 can be included in a single memory die or in multiple memory dice.

The memory cells in each of memory areas 102, 104, 106, and 108 can be arranged in rows and columns in the memory units. Each of the memory units can be a physical unit. For example, a group of a plurality of memory cells can form a memory unit. Each of the memory units can also be a logical unit. For example, the memory unit can be a block or a page that can be identified by a unique address such as a block address or a page address, respectively. For another example, wherein the memory areas 102, 104, 106, and 108 can include computer memories that include memory banks as a logical unit of data storage, the memory unit can be a bank that can be identified by a bank address. During a read or write operation, the unique address associated with a particular memory unit can be used to access that particular memory unit. Based on the unique address, information can be written to or retrieved from one or more memory cells in that particular memory unit.

The memory cells in the memory areas 102, 104, 106, and 108 can include non-volatile memory cells. Examples of non-volatile memory cells include flash memory cells, phase change random-access memory (PRAM) cells, magnetoresistive random-access memory (MRAM) cells, or other types of non-volatile memory cells. In an example implementation where the memory cells are configured as NAND flash memory cells, the read or write operation can be performed on a page basis. However, an erase operation in a NAND flash memory is performed on a block basis.

Each of the non-volatile memory cells can be configured as a single-level cell (SLC) or multiple-level memory cell. A single-level cell can store one bit of information per cell. A multiple-level memory cell can store more than one bit of information per cell. For example, each of the memory cells in the memory areas 102, 104, 106, and 108 can be configured as a multi-level cell (MLC) to store two bits of information per cell, a triple-level cell (TLC) to store three bits of information per cell, or a quad-level cells (QLC) to store four bits of information per cell. In another example, each of the memory cells in memory area 102, 104, 106, and 108 can be configured to store at least one bit of information (e.g., one bit of information or multiple bits of information), and each of the memory cells in memory area 102, 104, 106, and 108 can be configured to store more than one bit of information.

As shown in FIG. 1, the memory system 100 includes a controller module 120. The controller module 120 includes a memory interface 121 to communicate with the memory module 110, a host interface 126 to communicate with a host (not shown), a processor 124 to execute firmware-level code, and caches and memories 123 and 122, respectively to temporarily or persistently store executable firmware/instructions and associated information. In some implementations, the controller unit 120 can include an error correction engine 125 to perform error correction operation on information stored in the memory module 110. Error correction engine 125 can be configured to detect/correct single bit error or multiple bit errors. In another implementation, error correction engine 125 can be located in the memory module 110.

The host can be a device or a system that includes one or more processors that operate to retrieve data from the memory system 100 or store or write data into the memory system 100. In some implementations, examples of the host can include a personal computer (PC), a portable digital device, a digital camera, a digital multimedia player, a television, and a wireless communication device.

In some implementations, the controller module 120 can also include a host interface 126 to communicate with the host. Host interface 126 can include components that comply with at least one of host interface specifications, including but not limited to, Serial Advanced Technology Attachment (SATA), Serial Attached Small Computer System Interface (SAS) specification, Peripheral Component Interconnect Express (PCIe).

Figure 2:
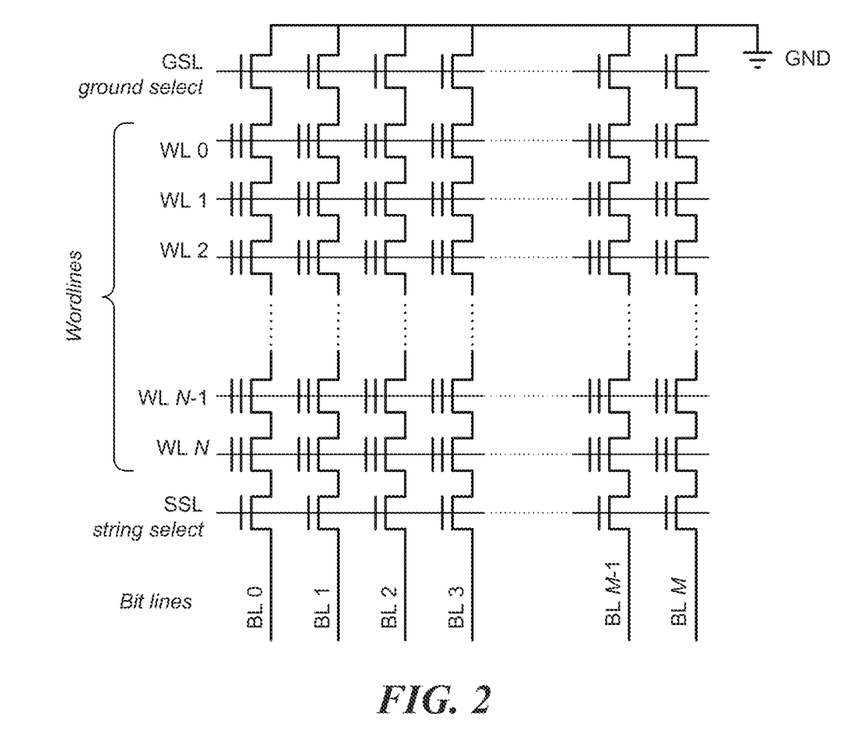
FIG. 2 is an illustration of an example non-volatile memory device.

FIG. 2 illustrates an example of a memory cell array implemented based on some embodiments of the disclosed technology.

In some implementations, the memory cell array can include NAND flash memory array that is partitioned into many blocks, and each block contains a certain number of pages. Each block includes a plurality of memory cell strings, and each memory cell string includes a plurality of memory cells.

In some implementations where the memory cell array is NAND flash memory array, read and write (program) operations are performed on a page basis, and erase operations are performed on a block basis. All the memory cells within the same block must be erased at the same time before performing a program operation on any page included in the block. In an implementation, NAND flash memories may use an even/odd bit-line structure. In another implementation, NAND flash memories may use an all-bit-line structure. In the even/odd bit-line structure, even and odd bit-lines are interleaved along each word-line and are alternatively accessed so that each pair of even and odd bit-lines can share peripheral circuits such as page buffers. In all-bit-line structure, all the bit-lines are accessed at the same time.

Figure 3:
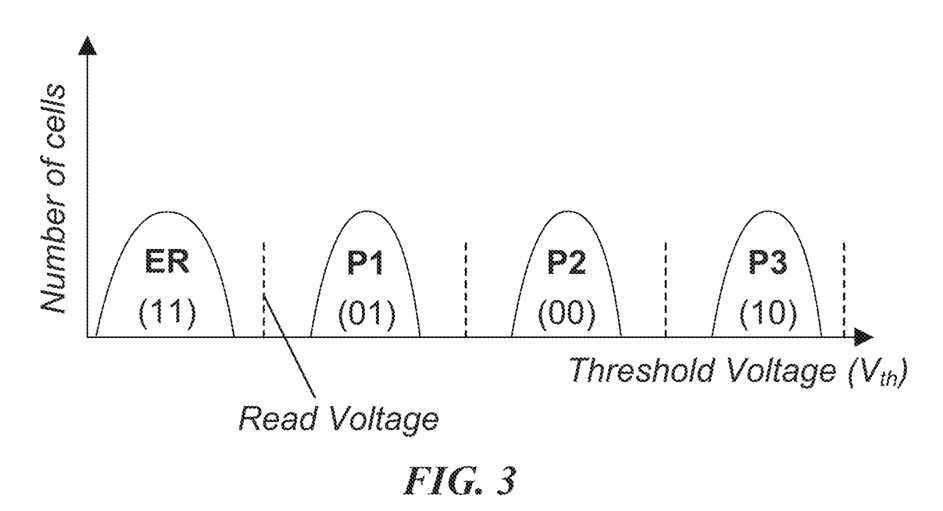
FIG. 3 is an example diagram illustrating the cell voltage level distribution ($V_{th}$) of a non-volatile memory device.

FIG. 3 illustrates an example of threshold voltage distribution curves in a multi-level cell device, wherein the number of cells for each program/erase state is plotted as a function of the threshold voltage. As illustrated therein, the threshold voltage distribution curves include the erase state (denoted "ER" and corresponding to "11") with the lowest threshold voltage, and three program states (denoted "P1", "P2" and "P3" corresponding to "01", "00" and "10", respectively) with read voltages in between the states (denoted by the dotted lines). In some embodiments, each of the threshold voltage distributions of program/erase states has a finite width because of differences in material properties across the memory array.

Although FIG. 3 shows a multi-level cell device by way of example, each of the memory cells can be configured to store any number of bits per cell. In some implementations, each of the memory cells can be configured as a single-level cell (SLC) to store one bit of information per cell, or as a triple-level cell (TLC) to store three bits of information per cell, or as a quad-level cells (QLC) to store four bits of information per cell.

In writing more than one data bit in a memory cell, fine placement of the threshold voltage levels of memory cells is needed because of the reduced distance between adjacent distributions. This is achieved by using incremental step pulse program (ISPP), i.e., memory cells on the same word-line are repeatedly programmed using a program-and-verify approach with a stair case program voltage applied to word-lines. Each programmed state associates with a verify voltage that is used in verify operations and sets the target position of each threshold voltage distribution window.

Read errors can be caused by distorted or overlapped threshold voltage distribution. An ideal memory cell threshold voltage distribution can be significantly distorted or overlapped due to, e.g., program and erase (P/E) cycle, cell-to-cell interference, and data retention errors, which will be discussed in the following, and such read errors may be managed in most situations by using error correction codes (ECC).

Figure 4:
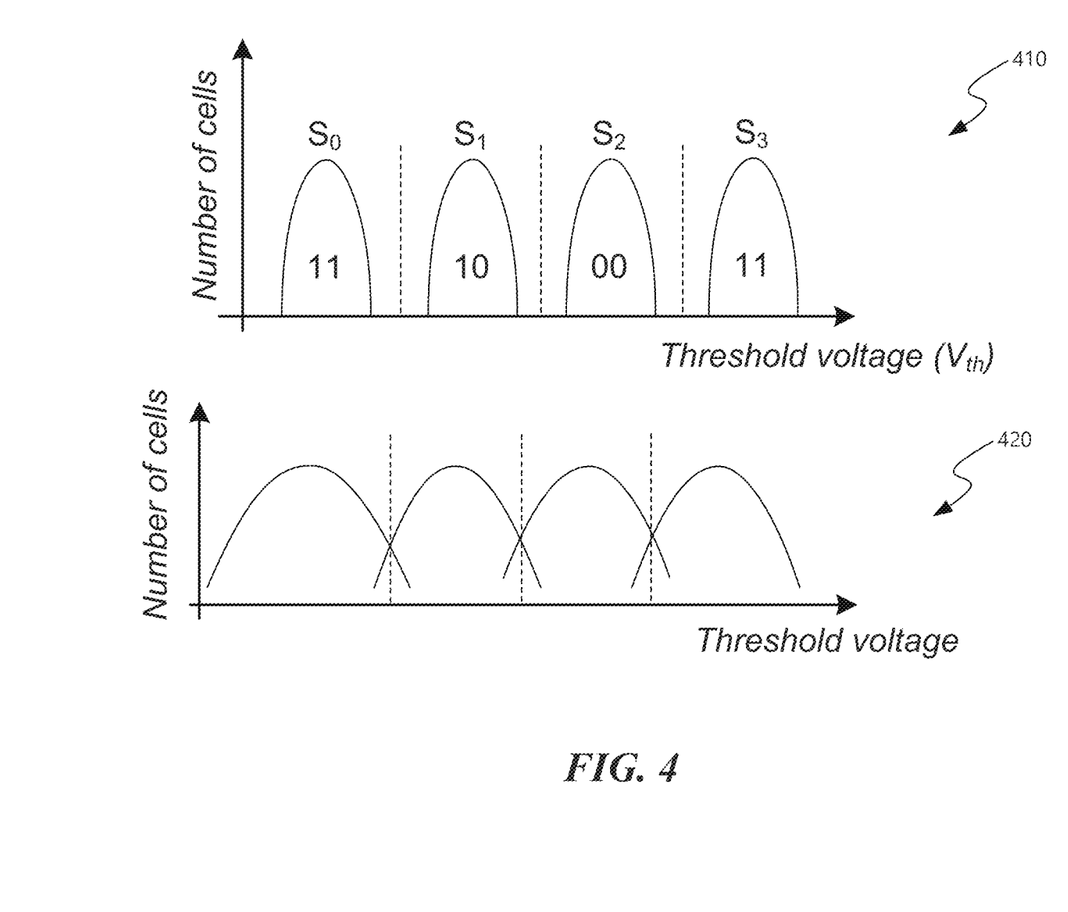
FIG. 4 is another example diagram illustrating the cell voltage level distribution ($V_{th}$) of a non-volatile memory device.

FIG. 4 illustrates an example of ideal threshold voltage distribution curves 410 and an example of distorted threshold voltage distribution curves 420. The vertical axis indicates the number of memory cells that has a particular threshold voltage represented on the horizontal axis.

For n-bit multi-level cell NAND flash memory, the threshold voltage of each cell can be programmed to $2^n$ possible values. In an ideal multi-level cell NAND flash memory, each value corresponds to a non-overlapping threshold voltage window.

Flash memory P/E cycling causes damage to a tunnel oxide of floating gate of a charge trapping layer of cell transistors, which results in threshold voltage shift and thus gradually degrades memory device noise margin. As P/E cycles increase, the margin between neighboring distributions of different programmed states decreases and eventually the distributions start overlapping. The data bit stored in a memory cell with a threshold voltage programmed in the overlapping range of the neighboring distributions may be misjudged as a value other than the original targeted value.

Figure 5:
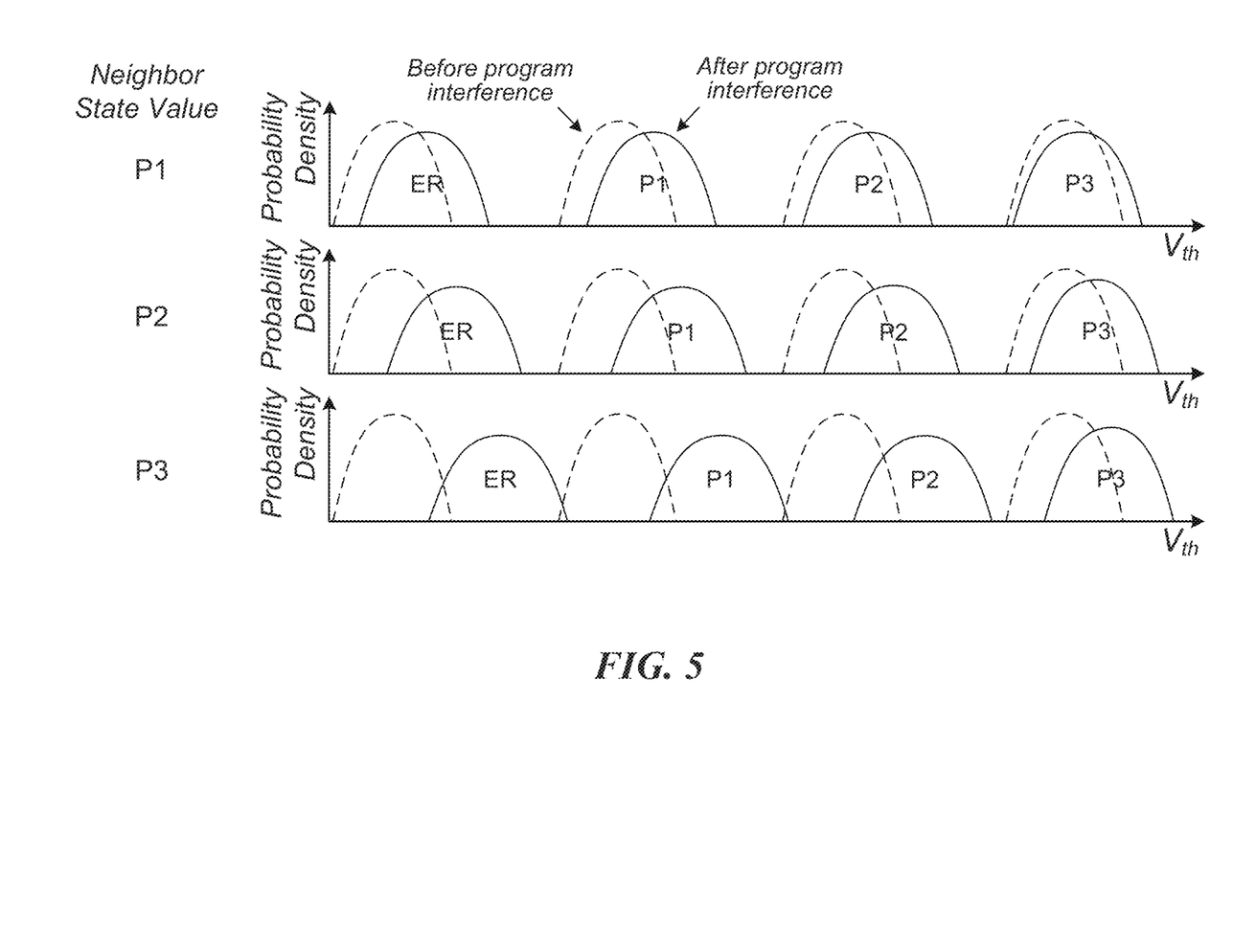
FIG. 5 is an example diagram illustrating the cell voltage level distribution ($V_{th}$) of a non-volatile memory device before and after program interference.

FIG. 5 illustrates an example of a cell-to-cell interference in NAND flash memory. The cell-to-cell interference can also cause threshold voltages of flash cells to be distorted. The threshold voltage shift of one memory cell transistor can influence the threshold voltage of its adjacent memory cell transistor through parasitic capacitance-coupling effect between the interfering cell and the victim cell. The amount of the cell-to-cell interference may be affected by NAND flash memory bit-line structure. In the even/odd bit-line structure, memory cells on one word-line are alternatively connected to even and odd bit-lines and even cells are programmed ahead of odd cells in the same word-line. Therefore, even cells and odd cells experience different amount of cell-to-cell interference. Cells in all-bit-line structure suffer less cell-to-cell interference than even cells in the even/odd bit-line structure, and the all-bit-line structure can effectively support high-speed current sensing to improve the memory read and verify speed.

The dotted lines in FIG. 5 denote the nominal distributions of P/E states (before program interference) of the cells under consideration, and the "neighbor state value" denotes the value that the neighboring state has been programmed to. As illustrated in FIG. 5, if the neighboring state is programmed to P1, the threshold voltage distributions of the cells under consideration shift by a specific amount. However, if the neighboring state is programmed to P2, which has a higher threshold voltage than P1, that results in a greater shift compared to the neighboring state being P1. Similarly, the shift in the threshold voltage distributions is greatest when the neighboring state is programmed to P3.

Figure 6:
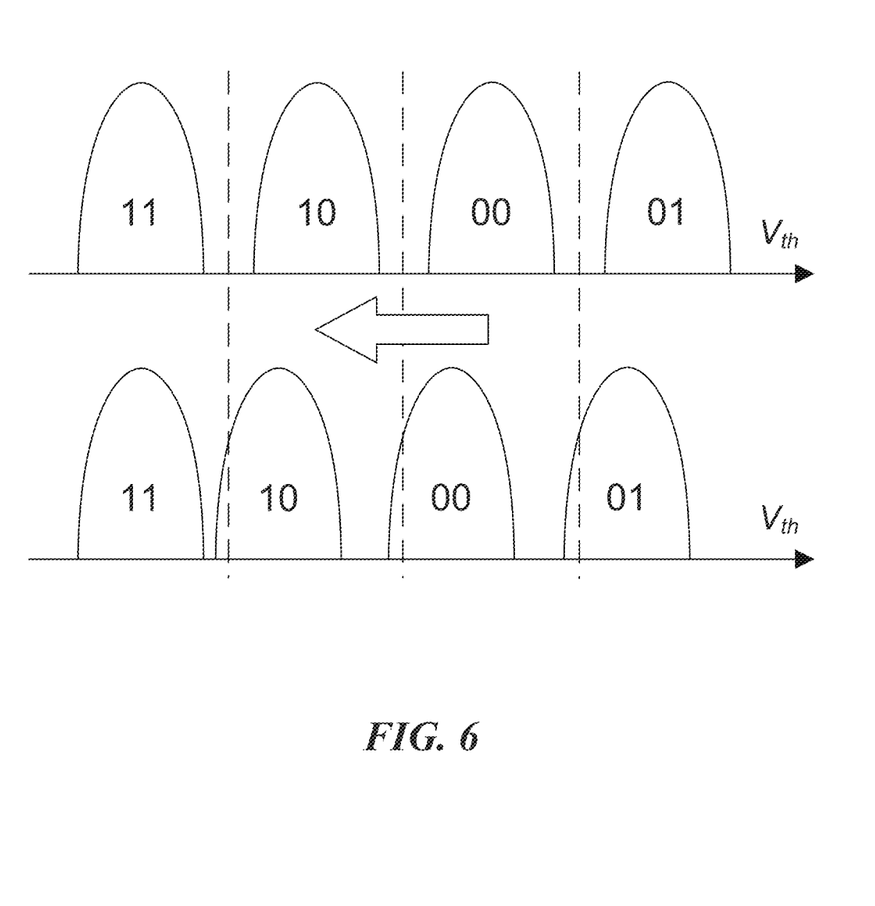
FIG. 6 is an example diagram illustrating the cell voltage level distribution ($V_{th}$) of a non-volatile memory device as a function of the reference voltage.

FIG. 6 illustrates an example of a retention error in NAND flash memory by comparing normal threshold-voltage distribution and shifted threshold-voltage distribution. The data stored in NAND flash memories tend to get corrupted over time and this is known as a data retention error. Retention errors are caused by loss of charge stored in the floating gate or charge trap layer of the cell transistor. Due to wear of the floating gate or charge trap layer, memory cells with more program erase cycles are more likely to experience retention errors. In the example of FIG. 6, comparing the top row of voltage distributions (before corruption) and the bottom row of distributions (contaminated by retention error) reveals a shift to the left.

In NAND-based storage systems (e.g., the examples illustrated in FIGS. 1-6), the threshold voltages can be estimated using a deep neural network (DNN). In an example, the optimal read voltages can be determined using a scheme that relies only on previous read observations, e.g., read biases, checksums and the ones count for each previous read attempt of the NAND flash page. Since this scheme does not use any additional read-attempts to estimate the optimal read-threshold voltage, there is no NAND sensing overhead and the overall latency for the scheme is determined by the forward-propagation step of the DNN.

The forward-propagation includes the transfer of the model parameters (weights & biases for each layer of the neural network) into appropriate registers and the multiply-accumulate operations using these transferred weights and the inputs to the DNN. Since registers and cache memory on the controller are limited, and the need for DNN inference is a rare event, the weights are stored in a separate memory and loaded whenever they are required. Loading the weights from a separate memory increases the latency of transferring weights. Furthermore, the accuracy of the read voltage estimation is reduced if the precision of the weights is low or reduced, and thus, a simple scaling of the trained parameters to a lower precision to reduce memory requirements often results in inaccurate estimation of optimal read-voltages.

The described embodiments advantageously reduce the latency and inference time by compressing the DNN. Compression techniques for DNNs attempt to reduce the computational complexity of DNNs without significantly impacting the DNN performance in an adverse manner. In an example, pruning, quantization, trained quantization, and Huffman coding (also referred to as Huffman encoding) are employed to compress the DNN. By compressing the DNN, the weight loading and inference time can be reduced.

Figure 7:
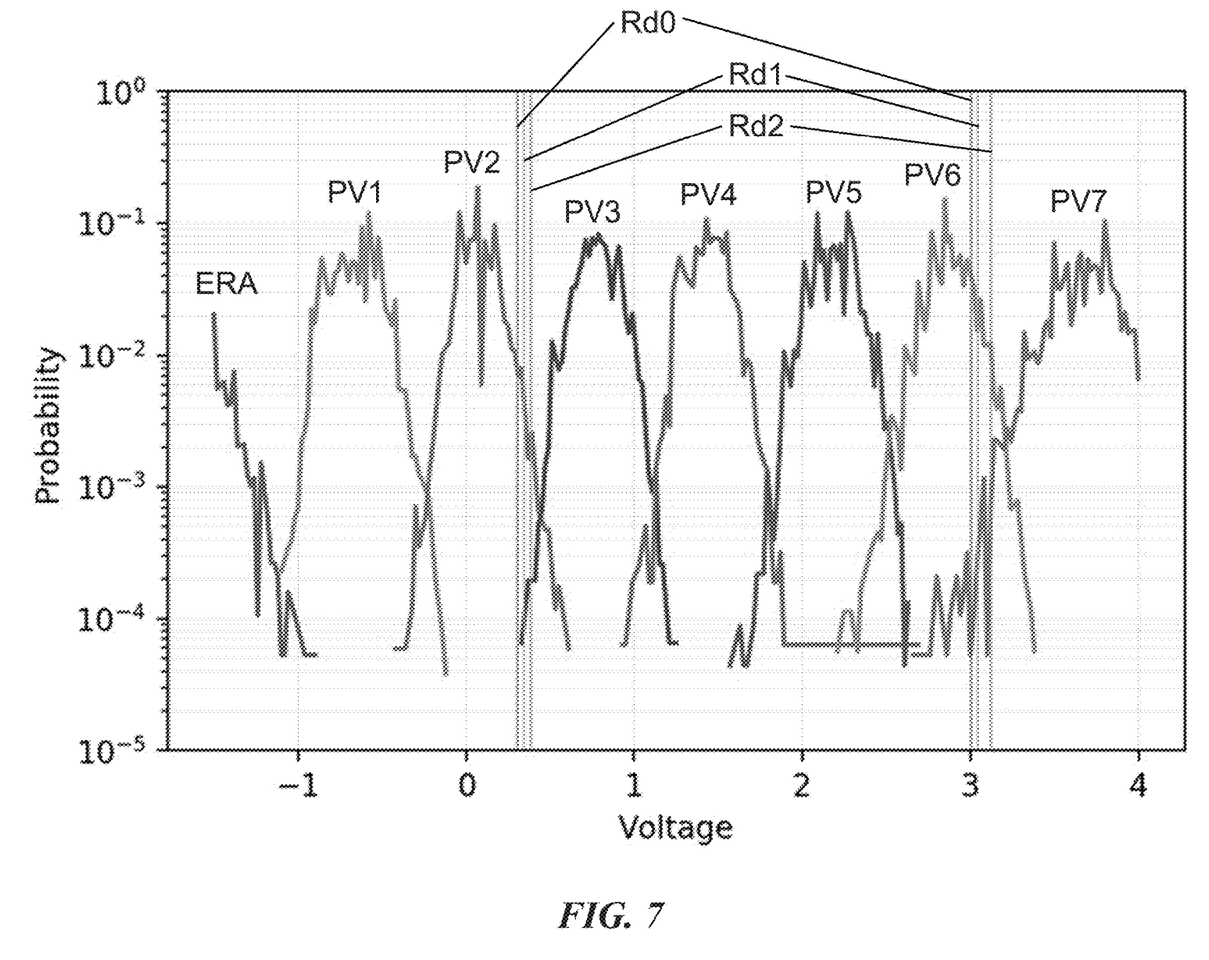
FIG. 7 illustrates an example of empirical voltage probability distributions and read thresholds for a triple level cell (TLC) NAND flash block.

FIG. 7 illustrates an example of empirical voltage probability distributions for a triple level cell (TLC) NAND flash block, wherein the read thresholds can be determined using a deep neural network with inputs that include read biases, checksums, and ones counts from a specified number of reads. The erase distribution (ERA) and program verify (PV) distributions (e.g., PV1-PV7) are shown in relation to the read thresholds (or read levels, e.g., Rd0, Rd1 and Rd2).

Figure 8:
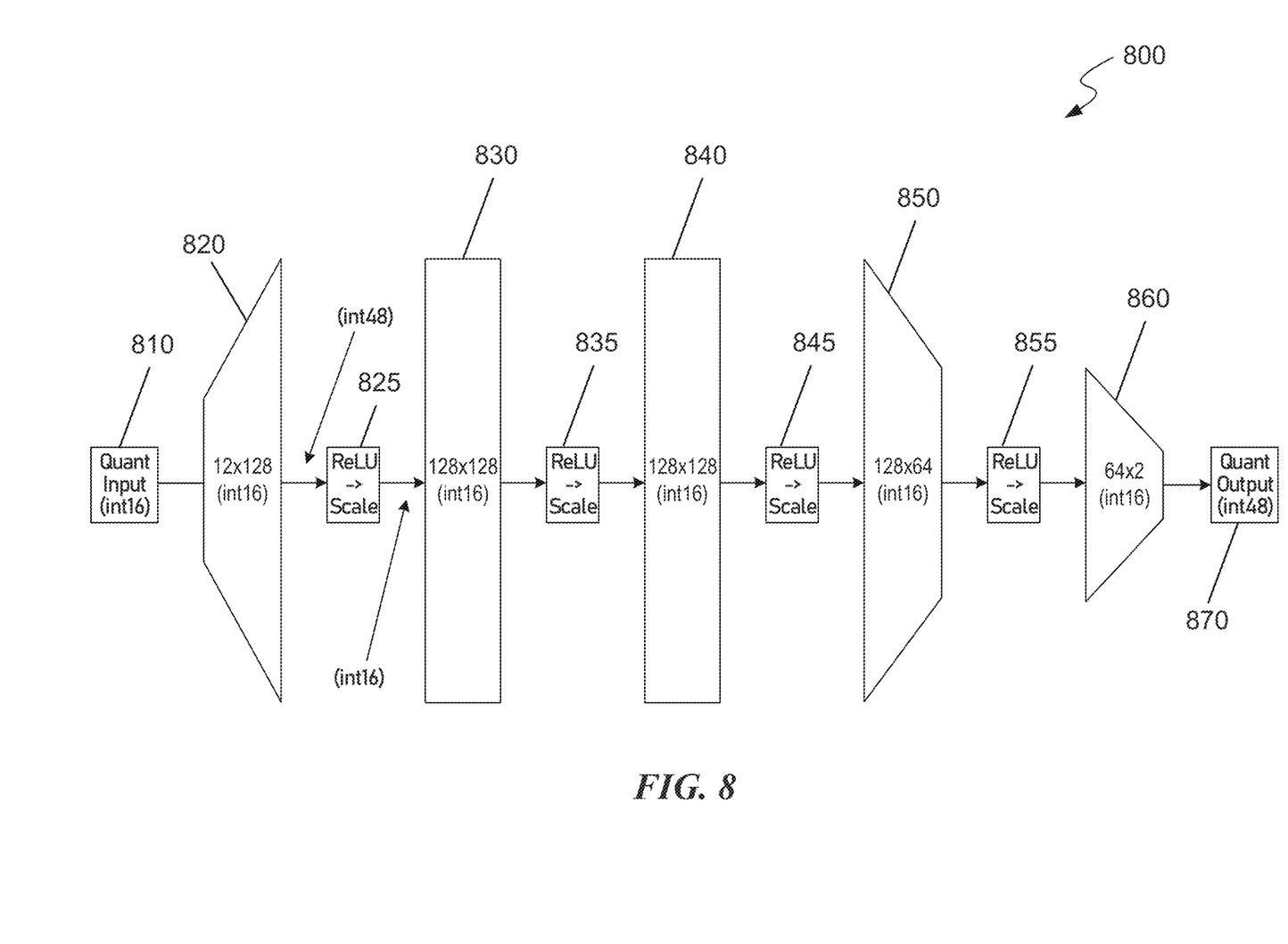
FIG. 8 is an example diagram illustrating a deep neural network (DNN) that can be configured to estimate optimal read offsets.

In some embodiments, the read thresholds in FIG. 7 can be estimated using the example DNN illustrated in FIG. 8. As shown therein, the DNN 800 includes multiple fully connected layers. In a fully connected layer, all the inputs from one layer are connected to every activation unit of the next layer. Different from a convolutional neural network (CNN) that is typically used to detect edges in image processing applications, the DNN illustrated in FIG. 8 is configured to use read biases, checksums, and ones counts from previous memory page reads and output an estimate of the optimal read voltages for that page. A CNN uses convolutional layers to detect edges and shapes by leveraging its translational equivariance properties, whereas the DNN discussed herein uses fully connected layers to determine optimal read thresholds.

In some embodiments, the input layer (820) and the hidden layers (830, 840 and 850) can have varying input and output dimensions. In the example illustrated in FIG. 8, the input layer 820 has dimensions 12×128, hidden layers 830 and 840 have dimensions 128×128, and hidden dimension 850 has dimensions 128×64. The input layer 820 and each of the hidden layers (830, 840, 850) are followed by a rectified linear unit (denoted ReLU) and a scaling function (denoted 825, 835, 845 and 855, respectively). The output layer 860 has an output dimension of two that provides estimates of the optimal read voltages for a page, which can be quantized to a higher precision using the output quantizer 870.

In some embodiments, the output dimension can be increased or decreased depending on the number of read voltages required for the logical page.

In some embodiments, the weights and biases are either quantized to a predetermined number of bits (e.g., 16-bit signed integers) or represented using floating point values. In the example illustrated in FIG. 8, the input layer 820, which receives 16-bit inputs from the input quantizer 810, operates using 16-bit integers (denoted int16) and generates a 48-bit output, which is subsequently scaled down to 16-bits through the ReLU and scaling operations. In this example, the storage required for the weights and biases requires 86,148 bytes.

The storage requirements for the weights and biases can be compressed to reduce the latency of the forward-propagation step. However, if the weights and biases are quantized with lossy compression, the accuracy of the estimated optimal read voltages by the compressed DNN may reduce. The accuracy loss must remain low to ensure that the optimal read voltages that are estimated do not adversely affect the performance of the memory device.

In some embodiments, the DNN can be compressed using one or more of pruning, quantization or trained quantization, and Huffman coding. Pruning the weights may include selecting a threshold and comparing each of the weights to the threshold to determine whether or not a particular weight is removed. In an example, the threshold can be based on the weight distribution in the particular layer that is being pruned. Alternatively, pruning the weights may include a predetermined percentage of weights in each layer.

Quantization is the process of representing values with a reduced number of bits, and may be applied to the weights, activations and gradient values in the DNN. In an example, non-uniform quantization, which allocates more bits to values that more common, may be applied. In Huffman coding, a prefix code commonly used for lossless data compression, a variable length code is used to represent the weights. Herein, a shorter codeword represents more commonly used weights and a longer codeword is used for less commonly used weight representations.

In some examples, uniform and non-uniform quantization methods followed by Huffman coding can be applied. In other examples, non-uniform quantization and Huffman coding may be applied to each layers' weights independently.

In some embodiments, an information-theoretic quantization method for lossy source coding may be used to achieve the best compression ratio while minimizing the estimation loss. In this example, the input to the quantizer is unquantized values corresponding to the weights and the biases of the network and the output of the quantizer is the quantized values corresponding to these weights and biases. A distortion metric between unquantized and quantized values, based on the probability mass functions of the unquantized values, is defined to minimize the overall distortion. This problem is cast into a scalar quantization problem by partitioning the valid range of the unquantized values into quantization regions in which each quantization region is an interval. Then the scalar quantizer determines which unquantized values will be mapped to the representative point in each region. When the mean-square error (MSE) is considered for the distortion metric, the Lloyd-Max algorithm outputs the optimal scalar quantizer that minimizes the overall mean-square error.

In some embodiments, Huffman coding is applied after quantization, and can further enhance the compression ratio by a factor of 4× to 7×, as shown in Table 1, for the R2 and R6 read levels for an LSB page. As shown therein, the estimation error is ~0V for most of the cases, and a bound on the compression ratio decreases as the level of quantization increases.

TABLE 1

Example compression results for different quantization

| Quantization | 99% Estimation Error R2 | 99% Estimation Error R6 | Compression Ratio (Bound) |
| --- | --- | --- | --- |
| 6-bit non-uniform | ~0.1 V | ~0.02 V | 7.62 |
| 8-bit non-uniform | Less than 0.02 V | ~0 V | 4.72 |
| 10-bit non-uniform | ~0 V | ~0 V | 2.75 |
| 12-bit non-uniform | ~0 V | ~0 V | 1.36 |

In some embodiments, for quantized and Huffman encoded weights, reconstruction or look-up tables (LUTs) can be used to obtain the 16-bit quantized weights for the DNN. An example is shown in Table 2, wherein the coded index for "1" is "11" and the coded index for "256" is "100100". That is, the Huffman encoding ensures that more probable indexes are represented using shorter coded indexes. Examples of the Huffman coded index for the 16-bit integer weights are shown in Table 2. It is noted that no coded index is a prefix of another coded index. Without loss of generality, the compression methods described herein can be generalized for any number of quantized weights.

TABLE 2

Example reconstruction table for weights

| Index | Coded index | 16-bit integer weight |
| --- | --- | --- |
| 1 | 11 | 1010 . . . 0110 |
| 2 | 010 | 1110 . . . 0110 |
| 3 | 101 | 0010 . . . 0110 |
| . . . | . . . | . . . |
| 256 | 100100 | 1010 . . . 1111 |

Figure 9:
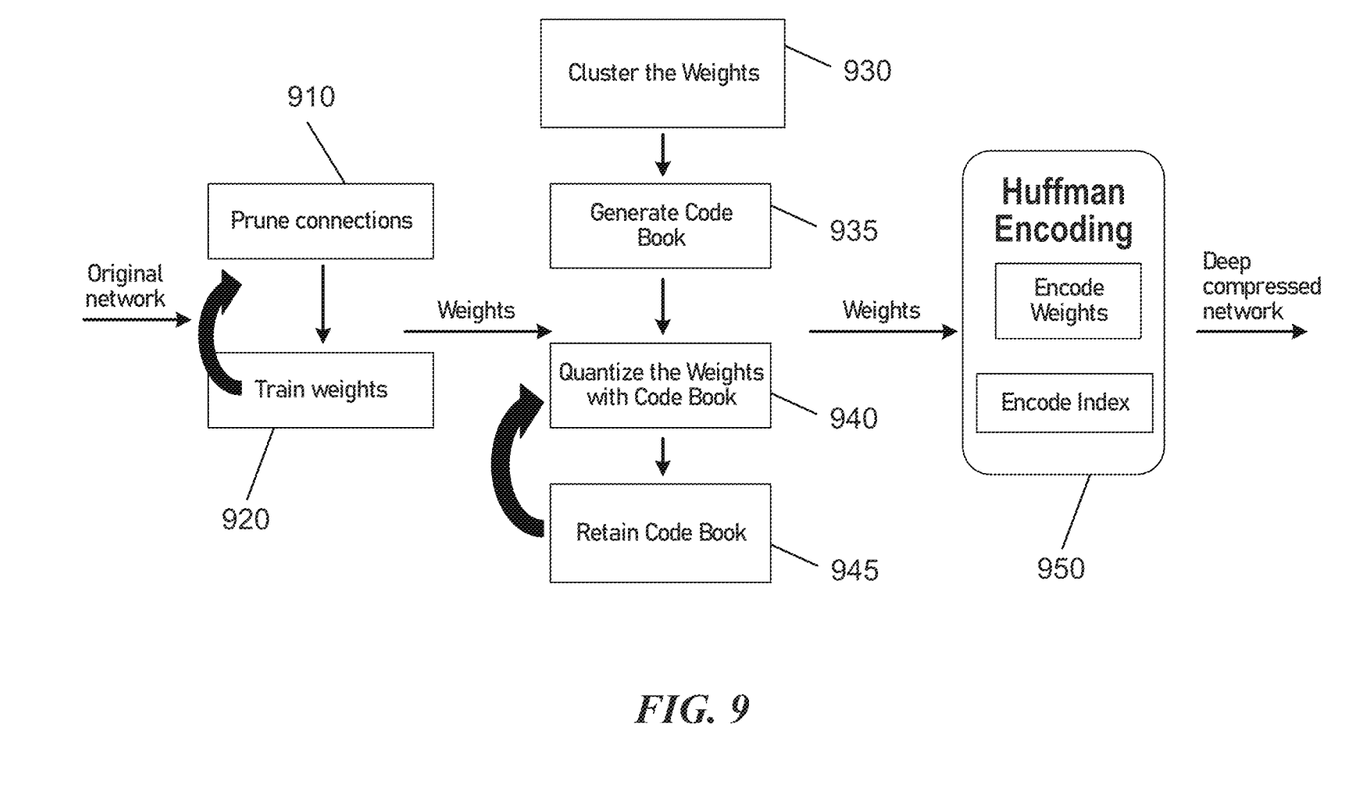
FIG. 9 illustrates a flowchart of an example method for compressing a DNN.

FIG. 9 illustrates a flowchart of an example method for compressing a DNN. As shown therein, the weights of the original (or input) neural network are first processed by a pruning operation that includes pruning the connections (910) and retraining the weights (920). The pruning and training operations may be iteratively performed to ensure that the performance of the original network does not significantly degrade despite the pruning operation.

The method continues with the pruned weights being processed by a quantization operation. In the example shown in FIG. 9, the vector quantization operation includes clustering the weights (930), generating a code book (935), quantizing the weight based on the code book (940), and retraining the code book (945). These operations attempt to represent the weights with the fewest codebook vectors while losing as little information as possible. As discussed earlier, the vector quantization operation minimizes a distortion metric (or reconstruction metric) that is defined as the difference between the unquantized (input) weights and the quantized (output, codebook-based) weights.

The quantized weights are now processed using a Huffman encoding operation 950, which uses variable-length codewords to encode source symbols (or weights in this case). In an example, the Huffman encoding table is derived based on the occurrence probability of for each source symbol, with more common symbols being represented with fewer bits.

The example method for compressing a DNN shown in FIG. 9 can be applied to DNN implementations with a large memory requirement for storing model parameters. In some embodiments, at least one of the pruning, quantization, or Huffman encoding operations shown in FIG. 9 may be skipped or bypassed.

Figure 10:
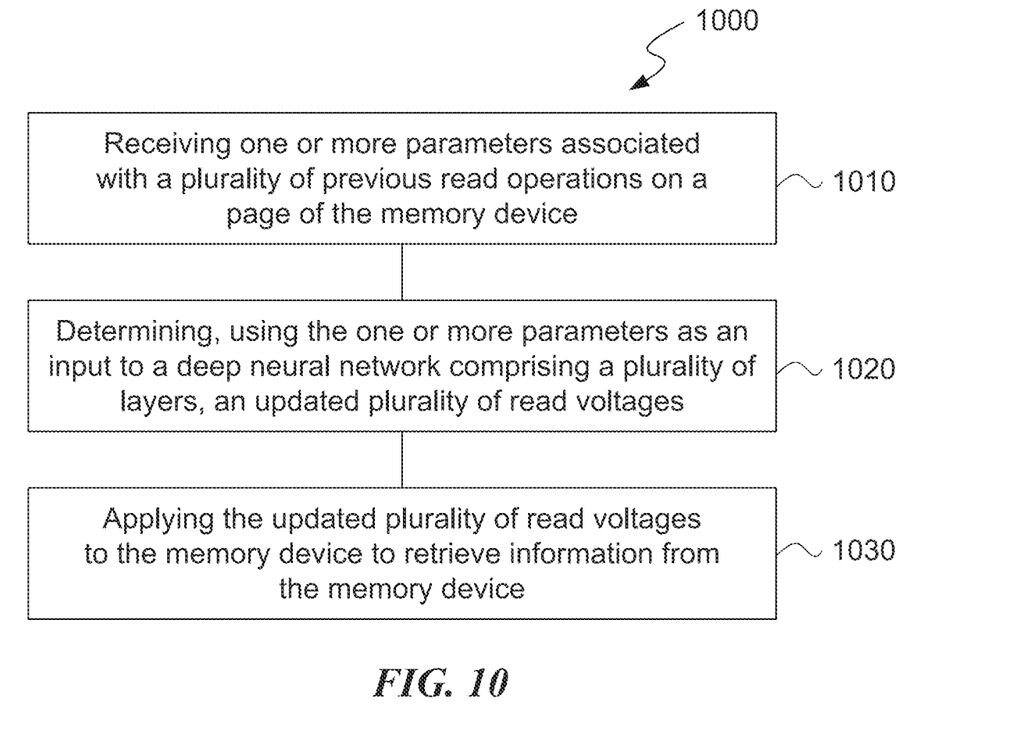
FIG. 10 illustrates a flowchart of an example method for improving performance of a memory device.

FIG. 10 illustrates a flowchart of a method 800 for improving performance of a memory device. The method 1000 includes, at operation 1010, receiving one or more parameters associated with a plurality of previous read operations on a page of the memory device. In some embodiments, the previous read operations are based on a plurality of read voltages, and the one or more parameters comprise at least one of a read bias, a ones count, or a checksum of an error correcting code for the page.

The method 1000 includes, at operation 1020, determining, using the one or more parameters as an input to a deep neural network comprising a plurality of layers, an updated plurality of read voltages, and each of the plurality of layers being a fully connected layer.

The method 1000 includes, at operation 1030, applying the updated plurality of read voltages to the memory device to retrieve information from the memory device, and the deep neural network using a plurality of weights that have been processed using at least one of a pruning operation, a non-uniform quantization operation, or a Huffman encoding operation.

Figure 11:
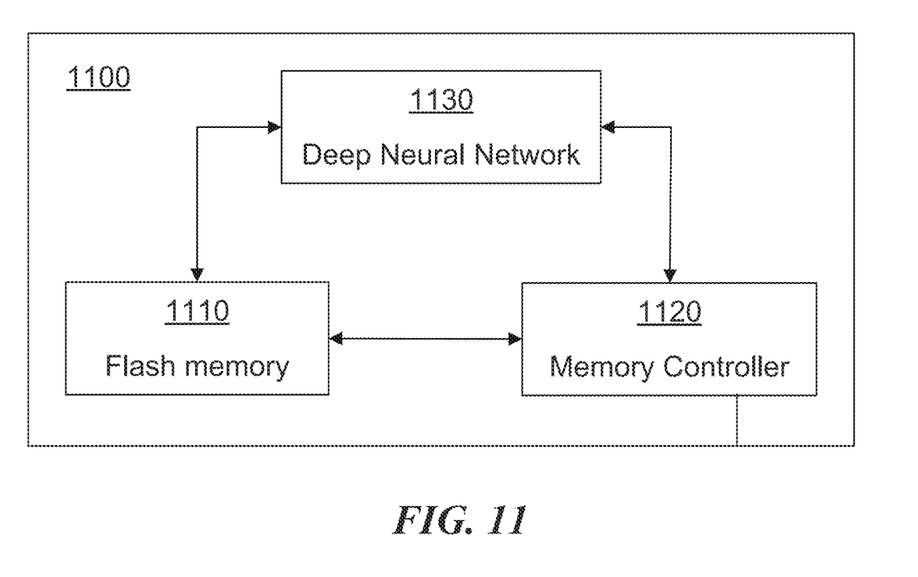
FIG. 11 is an example diagram illustrating a storage device that can be configured to implement the described embodiments.

In some embodiments, operations 1010 and 1020 can be performed by a memory controller (e.g., memory controller 1120 in FIG. 11), and operation 1030 can be performed by a memory device or the memory controller (e.g., flash memory 1110 and memory controller 1120, respectively, in FIG. 11). The updated plurality of read voltages are estimated using a DNN (e.g., the deep neural network 1130 in FIG. 11).

In some embodiments, the deep neural network uses the plurality of weights that are processed using at least the non-uniform quantization operation, and the non-uniform quantization operation is lossless.

In some embodiments, the deep neural network uses the plurality of weights that are processed using at least the non-uniform quantization operation, and the non-uniform quantization operation is configured to minimize a distortion metric between unquantized values of the plurality of weights and quantized values of the plurality of weights.

In some embodiments, the distortion metric is a mean-squared error (MSE).

In some embodiments, the page comprises a page of a triple level cell (TLC) NAND flash memory block.

In some embodiments, the deep neural network uses the plurality of weights that are processed using at least the non-uniform quantization operation and the Huffman encoding operation that are applied independently to weights in each of the plurality of layers.

In some embodiments, the deep neural network uses the plurality of weights that are processed using the pruning operation, the non-uniform quantization operation, and the Huffman encoding operation, and the method 1000 further comprises performing the pruning operation on an initial set of weights to generate pruned weights, wherein the initial set of weights are used by the deep neural network prior to the processing by at least one (a) the pruning operation, (b) the non-uniform quantization operation, or (c) the Huffman encoding operation, performing the non-uniform quantization operation on the pruned weights to generate pruned and quantized weights, and performing the Huffman encoding operation on the pruned and quantized weights to generate the plurality of weights.

FIG. 11 is an example diagram illustrating a storage device that can be configured to implement the described embodiments. Referring to FIG. 11, a data storage device 1100 may include a flash memory 1110, a memory controller 1120, and a deep neural network (DNN) 1130. The memory controller 1120 may control the flash memory 1110 and the DNN 1130 in response to control signals input from the outside of the data storage device 1100. In the data storage device 1100, the flash memory 1110 may be configured the same or substantially the same as a nonvolatile memory device. That is, the flash memory 1110 may read data from selected memory cells using different read voltages to output it to the memory controller 1120. The different read voltages may be estimated using the DNN 1130 based on the embodiments described in this document. In an example, DNN 1130 may be the DNN illustrated in FIG. 8.

In some embodiments, the data storage device 1100 may be a memory card device, an SSD device, a multimedia card device, an SD card, a memory stick device, a HDD device, a hybrid drive device, or an USB flash device. For example, the data storage device 1100 may be a card which satisfies the standard for user devices such as a digital camera, a personal computer, and so on.

Implementations of the subject matter and the functional operations described in this patent document can be implemented in various systems, digital electronic circuitry, or in computer software, firmware, or hardware, including the structures disclosed in this specification and their structural equivalents, or in combinations of one or more of them. Implementations of the subject matter described in this specification can be implemented as one or more computer program products, i.e., one or more modules of computer program instructions encoded on a tangible and non-transitory computer readable medium for execution by, or to control the operation of, data processing apparatus. The computer readable medium can be a machine-readable storage device, a machine-readable storage substrate, a memory device, a composition of matter effecting a machine-readable propagated signal, or a combination of one or more of them. The term "data processing unit" or "data processing apparatus" encompasses all apparatus, devices, and machines for processing data, including by way of example a programmable processor, a computer, or multiple processors or computers. The apparatus can include, in addition to hardware, code that creates an execution environment for the computer program in question, e.g., code that constitutes processor firmware, a protocol stack, a database management system, an operating system, or a combination of one or more of them.

A computer program (also known as a program, software, software application, script, or code) can be written in any form of programming language, including compiled or interpreted languages, and it can be deployed in any form, including as a stand-alone program or as a module, component, subroutine, or other unit suitable for use in a computing environment. A computer program does not necessarily correspond to a file in a file system. A program can be stored in a portion of a file that holds other programs or data (e.g., one or more scripts stored in a markup language document), in a single file dedicated to the program in question, or in multiple coordinated files (e.g., files that store one or more modules, sub programs, or portions of code). A computer program can be deployed to be executed on one computer or on multiple computers that are located at one site or distributed across multiple sites and interconnected by a communication network.

The processes and logic flows described in this specification can be performed by one or more programmable processors executing one or more computer programs to perform functions by operating on input data and generating output. The processes and logic flows can also be performed by, and apparatus can also be implemented as, special purpose logic circuitry, e.g., an FPGA (field programmable gate array) or an ASIC (application specific integrated circuit).

Processors suitable for the execution of a computer program include, by way of example, both general and special purpose microprocessors, and any one or more processors of any kind of digital computer. Generally, a processor will receive instructions and data from a read only memory or a random access memory or both. The essential elements of a computer are a processor for performing instructions and one or more memory devices for storing instructions and data. Generally, a computer will also include, or be operatively coupled to receive data from or transfer data to, or both, one or more mass storage devices for storing data, e.g., magnetic, magneto optical disks, or optical disks. However, a computer need not have such devices. Computer readable media suitable for storing computer program instructions and data include all forms of non-volatile memory, media and memory devices, including by way of example semiconductor memory devices, e.g., EPROM, EEPROM, and flash memory devices. The processor and the memory can be supplemented by, or incorporated in, special purpose logic circuitry.

While this patent document contains many specifics, these should not be construed as limitations on the scope of any invention or of what may be claimed, but rather as descriptions of features that may be specific to particular embodiments of particular inventions. Certain features that are described in this patent document in the context of separate embodiments can also be implemented in combination in a single embodiment. Conversely, various features that are described in the context of a single embodiment can also be implemented in multiple embodiments separately or in any suitable subcombination. Moreover, although features may be described above as acting in certain combinations and even initially claimed as such, one or more features from a claimed combination can in some cases be excised from the combination, and the claimed combination may be directed to a subcombination or variation of a subcombination.

Similarly, while operations are depicted in the drawings in a particular order, this should not be understood as requiring that such operations be performed in the particular order shown or in sequential order, or that all illustrated operations be performed, to achieve desirable results. Moreover, the separation of various system components in the embodiments described in this patent document should not be understood as requiring such separation in all embodiments.

Only a few implementations and examples are described and other implementations, enhancements and variations can be made based on what is described and illustrated in this patent document.

What is claimed is:

1. A method for improving performance of a memory device, comprising:
    receiving one or more parameters associated with a plurality of previous read operations on a page of the memory device, wherein the previous read operations are based on a plurality of read voltages, and wherein the one or more parameters comprise at least one of a read bias, a ones count, or a checksum of an error correcting code for the page;
    determining, using the one or more parameters as an input to a deep neural network comprising a plurality of layers, an updated plurality of read voltages, wherein each of the plurality of layers is a fully connected layer; and
    applying the updated plurality of read voltages to the memory device to retrieve information from the memory device,
    wherein the deep neural network uses a plurality of weights that have been processed using at least one of (a) a pruning operation, (b) a non-uniform quantization operation, or (c) a Huffman encoding operation.

2. The method of claim 1, wherein the deep neural network uses the plurality of weights that are processed using at least the non-uniform quantization operation, and wherein the non-uniform quantization operation is lossless.

3. The method of claim 1, wherein the deep neural network uses the plurality of weights that are processed using at least the non-uniform quantization operation, wherein the non-uniform quantization operation is configured to minimize a distortion metric between unquantized values of the plurality of weights and quantized values of the plurality of weights.

4. The method of claim 3, wherein the distortion metric is a mean-squared error (MSE).

5. The method of claim 1, wherein the page comprises a page of a triple level cell (TLC) NAND flash memory block.

6. The method of claim 1, wherein the deep neural network uses the plurality of weights that are processed using at least the non-uniform quantization operation and the Huffman encoding operation that are applied independently to weights in each of the plurality of layers.

7. The method of claim 1, wherein the deep neural network uses the plurality of weights that are processed using the pruning operation, the non-uniform quantization operation, and the Huffman encoding operation, and wherein the method further comprises:
    performing the pruning operation on an initial set of weights to generate pruned weights, wherein the initial set of weights are used by the deep neural network prior to the processing by at least one (a) the pruning operation, (b) the non-uniform quantization operation, or (c) the Huffman encoding operation;
    performing the non-uniform quantization operation on the pruned weights to generate pruned and quantized weights; and
    performing the Huffman encoding operation on the pruned and quantized weights to generate the plurality of weights.

8. A system for improving a decoding efficiency of a decoder in a non-volatile memory, comprising:
a processor and a memory including instructions stored thereupon, wherein the instructions upon execution by the processor cause the processor to:
receive one or more parameters associated with a plurality of previous read operations on a page of the memory device, wherein the previous read operations are based on a plurality of read voltages, and wherein the one or more parameters comprise at least one of a read bias, a ones count, or a checksum of an error correcting code for the page;
determine, using the one or more parameters as an input to a deep neural network comprising a plurality of layers, an updated plurality of read voltages, wherein each of the plurality of layers is a fully connected layer; and
apply the updated plurality of read voltages to the memory device to retrieve information from the memory device,
wherein the deep neural network uses a plurality of weights that have been processed using at least one of (a) a pruning operation, (b) a non-uniform quantization operation, or (c) a Huffman encoding operation.

9. The system of claim 8, wherein the deep neural network uses the plurality of weights that are processed using at least the non-uniform quantization operation, and wherein the non-uniform quantization operation is lossless.

10. The system of claim 8, wherein the deep neural network uses the plurality of weights that are processed using at least the non-uniform quantization operation, wherein the non-uniform quantization operation is configured to minimize a distortion metric between unquantized values of the plurality of weights and quantized values of the plurality of weights.

11. The system of claim 10, wherein the distortion metric is a mean-squared error (MSE).

12. The system of claim 8, wherein the page comprises a page of a triple level cell (TLC) NAND flash memory block.

13. The system of claim 8, wherein the deep neural network uses the plurality of weights that are processed using at least the non-uniform quantization operation and the Huffman encoding operation that are applied independently to weights in each of the plurality of layers.

14. The system of claim 8, wherein the deep neural network uses the plurality of weights that are processed using the pruning operation, the non-uniform quantization operation, and the Huffman encoding operation, and wherein the instructions upon execution by the processor further cause the processor to:
perform the pruning operation on an initial set of weights to generate pruned weights, wherein the initial set of weights are used by the deep neural network prior to the processing by at least one (a) the pruning operation, (b) the non-uniform quantization operation, or (c) the Huffman encoding operation;
perform the non-uniform quantization operation on the pruned weights to generate pruned and quantized weights; and
perform the Huffman encoding operation on the pruned and quantized weights to generate the plurality of weights.

15. A non-transitory computer-readable storage medium having instructions stored thereupon for improving a decoding efficiency of a decoder in a non-volatile memory, comprising:
instructions for receiving one or more parameters associated with a plurality of previous read operations on a page of the memory device, wherein the previous read operations are based on a plurality of read voltages, and wherein the one or more parameters comprise at least one of a read bias, a ones count, or a checksum of an error correcting code for the page;
instructions for determining, using the one or more parameters as an input to a deep neural network comprising a plurality of layers, an updated plurality of read voltages, wherein each of the plurality of layers is a fully connected layer; and
instructions for applying the updated plurality of read voltages to the memory device to retrieve information from the memory device,
wherein the deep neural network uses a plurality of weights that have been processed using at least one of (a) a pruning operation, (b) a non-uniform quantization operation, or (c) a Huffman encoding operation.

16. The non-transitory computer-readable storage medium of claim 15, wherein the deep neural network uses the plurality of weights that are processed using at least the non-uniform quantization operation, and wherein the non-uniform quantization operation is lossless.

17. The non-transitory computer-readable storage medium of claim 15, wherein the deep neural network uses the plurality of weights that are processed using at least the non-uniform quantization operation, wherein the non-uniform quantization operation is configured to minimize a distortion metric between unquantized values of the plurality of weights and quantized values of the plurality of weights.

18. The non-transitory computer-readable storage medium of claim 15, wherein the page comprises a page of a triple level cell (TLC) NAND flash memory block.

19. The non-transitory computer-readable storage medium of claim 15, wherein the deep neural network uses the plurality of weights that are processed using at least the non-uniform quantization operation and the Huffman encoding operation that are applied independently to weights in each of the plurality of layers.

20. The non-transitory computer-readable storage medium of claim 15, wherein the deep neural network uses the plurality of weights that are processed using the pruning operation, the non-uniform quantization operation, and the Huffman encoding operation, and wherein the non-transitory computer-readable storage medium further comprises:
instructions for performing the pruning operation on an initial set of weights to generate pruned weights, wherein the initial set of weights are used by the deep neural network prior to the processing by at least one (a) the pruning operation, (b) the non-uniform quantization operation, or (c) the Huffman encoding operation;
instructions for performing the non-uniform quantization operation on the pruned weights to generate pruned and quantized weights; and
instructions for performing the Huffman encoding operation on the pruned and quantized weights to generate the plurality of weights.

* * * * *